(12) United States Patent
Tanba et al.

(10) Patent No.: US 6,963,069 B2
(45) Date of Patent: Nov. 8, 2005

(54) CHARGED PARTICLE BEAM DEVICE

(75) Inventors: Yuusuke Tanba, Hitachinaka (JP);
Mitsugu Sato, Hitachinaka (JP);
Kaname Takahashi, Hitachinaka (JP);
Shunya Watanabe, Hitachinaka (JP);
Mine Nakagawa, Hitachinaka (JP);
Atsushi Muto, Hitachinaka (JP);
Akinari Morikawa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/767,262

(22) Filed: Jan. 30, 2004

(65) Prior Publication Data

US 2004/0238752 A1    Dec. 2, 2004

(30) Foreign Application Priority Data

Jan. 31, 2003   (JP)   ............................. 2003-022973
Jan. 7, 2004    (JP)   ............................. 2004-001548

(51) Int. Cl.$^7$ ........................................... H01J 37/28
(52) U.S. Cl. ..................... 250/311; 250/310; 250/397
(58) Field of Search ........................... 250/307, 310, 250/311, 397

(56) References Cited

U.S. PATENT DOCUMENTS 3,717,761 A * 2/1973 Koike et al. ................. 250/311
4,211,924 A * 7/1980 Muller et al. ............... 250/311

OTHER PUBLICATIONS

"A STEM image observation utilizing secondary electron detector" Masaru Katoh. Medical and biological scanning electron microscope, vol. 11, 1982, pp. 15-16.

* cited by examiner

*Primary Examiner*—Jack I. Berman
(74) *Attorney, Agent, or Firm*—Dickstein Shapiro Morin & Oshinsky LLP

(57) ABSTRACT

The charged particle beam device of this invention separately detects secondary signal particles emitted from the surface of a sample, dark field signal particles scattered within and transmitted through the sample, bright field signal particles transmitted through the sample without being scattered within the sample, and thereby allows the operator to observe the image with an optimum contrast according to applications. In order to detect only the dark field transmitted signal particles scattered within the sample, among the transmitted signal particles obtained by the primary charged particle beams having transmitted through the thin film sample, the device includes a transmitted signal conversion member having an opening through which the bright field transmitted signal particles not being scattered within the sample can pass, and a detection means for detecting signals colliding against the conversion member.

20 Claims, 18 Drawing Sheets

An image of the secondary signal particles
emitted from the surface of the sample An image (bright field signal image) of the signal particles transmitted
through the sample without being scattered within the sample An image (dark field signal image) of the signal particles
scattered within and transmitted through the sample A dark field image of scattered electrons with the scattering angle of more than 2°

A dark field image of scattered with the scattering angle of more than 6°

A dark field image of scattered with the scattering angle of more than 8°

View from arrow P

A secondary electron image

A bright field signal image

A dark field signal image

A dark field signal image in which the bright field signal (inverted signal) is mixed into the dark field signal A dark field signal image in which the mixture of the bright field signal is prevented

CHARGED PARTICLE BEAM DEVICE

FIELD OF THE INVENTION

The present invention relates to a charged particle beam device, specifically to a charged particle beam device that detects and discriminates signal particles emitted from a sample toward the source of charged particles, signal particles scattered within and transmitted through the sample, and signal particles transmitted through the sample without being scattered within the sample to thereby attain high-contrast sample images.

BACKGROUND OF THE INVENTION

The charged particle beam device represented by the scanning electron microscope scans finely converged charged particle beams on a sample to attain desired information from the sample (for example, sample images). This sort of charged particle beam device is used in most cases for the evaluation of semiconductor devices or the analysis of the defectives thereof. The trend of microstructure and multi-layered structure in the semiconductor devices advances year by year, and in order to analyze the defectives of multi-layered devices, a method of evaluating a device by using a thin film thereof has become important. A transmission signal transmitted through the sample is generally used for observing a thin film sample. Since the transmission signal (dark field signal) scattered within and transmitted through the sample significantly reflects the atomic number contrast of the sample, it is known to be effective for analyzing the defectives of a device.

The conventional method of detecting transmitted signal particles will be described with reference to FIG. 5 and FIG. 6. As shown in FIG. 5, in the charged particle beam device that incorporates a sample stage to observe a large sample, a sample stage 160 is disposed below an objective lens 20, and a thin film sample 14 is mounted on this stage. Signal particles (18a, 18b) transmitted through the thin film sample 14 pass through a through hole 161 which is bored in the sample stage 160 for the transmitted signal particles, and are detected by a transmitted signal detector 17 furnished below the sample stage. Here, among the transmitted signal particles, only the signal particles 18a having passed through the through hole 161 are detected by the transmitted signal detector 17. And, an aperture 19 is provided between the sample stage 160 and the transmitted signal detector 17, to restrict the scattering angles of the signal particles 18a detected by the transmitted signal detector 17. On the other hand, the magnetic field generated by the objective lens 20 to focus the primary beams, is formed on the upper area (toward the source of charged particles) viewed from the bottom of the objective lens. Therefore, secondary signal particles 11 emitted from the surface of the sample 14 are attracted to an electrostatic field 130 generated by a secondary signal detector 13 provided below the objective lens, and are detected by the secondary signal detector 13.

Further, the non-patent document 1 ("A STEM image observation utilizing secondary electron detector", reports of the Japanese Medical SEM Symposium, vol. 11, 15–16 (1982)) discloses the following method of obtaining the transmitted signal image of the sample 14. As shown in FIG. 6, the method uses a sample mount 150 with a metal part covering an area under the thin film sample 14. The secondary signal detector 13 disposed below the objective lens detects secondary signal particles 12 emitted by collision of the transmitted signal particles (18a, 18b) against the metal part under the sample, thus obtaining the transmitted signal image of the sample 14. Also in this case, since the focusing magnetic field by the objective lens is generated on the upper area (toward the source of charged particles) viewed from the bottom of the objective lens, the secondary signal particles 11 emitted from the surface of the sample 14 are attracted to the electrostatic field 130 generated by the secondary signal detector 13 below the objective lens, and are detected by the secondary signal detector 13.

SUMMARY OF THE INVENTION

Both of the above conventional techniques involve the following problem.

In the conventional technique shown in FIG. 5, the transmitted signal detector 17 for detecting the signal particles transmitted through the sample is disposed below the sample stage 160, which accordingly enlarges the distance between the sample 14 and the transmitted signal detector 17, and requires a transmitted signal detector having a very large detection area in order to detect the signal particles scattered within and transmitted through the sample (18b: dark field signal). Since the transmitted signal particles (18a, 18b) are detected after passing through the through hole 161 provided in the sample stage, it is necessary to sufficiently enlarge the through hole 161 for the transmitted signal particles in order to detect the signal particles scattered within and transmitted through the sample (18b). However, this leads to lowering the strength of a base 16 that supports the sample stage and deteriorating the vibration proof of the sample stage. If the through hole 161 is not too large to maintain the vibration proof of the stage for the practical use, the scattered and transmitted signal particles 18b collide against the inner wall of the through hole 161, as shown in FIG. 5, and in consequence, the particles 18b cannot be detected.

The conventional technique shown in FIG. 6 is devised for the purpose of obtaining the transmitted signal image (STEM image) equivalent to that obtained by the transmitted signal detector 17 with more ease without using the transmitted signal detector 17 as shown in FIG. 5. The scanning electron microscope is generally provided with the secondary signal detector 13 below the objective lens for detecting the secondary signal emitted from the sample. Therefore, if this secondary signal detector 13 is able to detect the transmitted signal, it would be possible to observe the STEM image with an inexpensive structure without using the expensive transmitted signal detector 17. Accordingly, in the conventional technique as shown in FIG. 6, the area under the sample is covered with the metal part, so that the signal particles transmitted through the sample collide against the metal part. The secondary signal particles emitted by this collision are detected by the secondary signal detector 13 disposed below the objective lens. However in this case, since the focusing magnetic field by the objective lens is generated on the upper area (toward the source of charged particles) viewed from the bottom of the objective lens, the leakage of the magnetic field generated by the objective lens is extremely insignificant on the sample. Therefore, the low-energy second signal particles emitted from the surface of the sample are attracted to an extraction field of the secondary signal detector 13, and can be detected by the secondary signal detector 13. In consequence, the signal detected by the secondary signal detector 13 is the sum of the transmitted signal and the secondary signal. As the result, the minute contrast that is essentially included only in the transmitted signal is disturbed by the contrast of the secondary signal detected at the same time as the transmitted signal, which makes it difficult to attain high-contrast STEM images.

On the other hand, in order to attain high-contrast and high-resolution STEM images, it is preferable to detect and discriminate the signal particles scattered within and transmitted through the sample (dark field signal particles) and the signal particles transmitted through the sample without being scattered within the sample (bright field signal particles). The reason is because the bright field signal particles and the dark field signal particles include inverted information in contrast by each other, and the sum of these signal particles leads to cancellation of the contrasts. FIG. 3 comparatively illustrates an image of the secondary signal particles emitted from the surface of the sample (FIG. 3A), an image (bright field signal image) of the signal particles transmitted through the sample without being scattered within the sample (FIG. 3B), and an image (dark field signal image) of the signal particles scattered within and transmitted through the sample (FIG. 3C). From FIG. 3B and FIG. 3C it can be found that the bright field signal image and the dark field signal image are inverted in contrast by each other. In the conventional technique as shown in FIG. 6, all the bright field signal particles (18a) and the dark field signal particles (18b) collide against the metal part under the sample to emit the secondary signal particles 12, so that the signal information detected by the secondary signal detector 13 is the sum of both. Accordingly, as explained above, the contrasts are cancelled, and a high-contrast STEM image cannot be attained, which is a problem to be solved.

It is accordingly an object of the present invention to provide a charged particle beam device suitable for detecting the dark field signal particles scattered within and transmitted through the sample, separately from the other signal particles.

In order to accomplish the foregoing object, according to one aspect of the present invention, the charged particle beam device includes a transmitted signal conversion member for emitting secondary charged particles by the collisions of charged particles transmitted through a sample, and the transmitted signal conversion member is provided with an opening of a size, through which the charged particles transmitted through the sample without being scattered within the sample can pass.

According to another aspect of the present invention, the charged particle beam device includes a scintillator for emitting light by the collisions of charged particles transmitted through a sample, and a means for converting the light emitted from the scintillator into an electric signal at a position to detect the light, and also the scintillator is provided with an opening of a size, through which the charged particles transmitted through the sample without being scattered within the sample can pass.

According to the above constructions, it becomes possible to separate the dark field transmitted signal particles and the bright field transmitted signal particles, and at least to efficiently detect the dark field transmitted signal particles.

According to another aspect of the present invention, the charged particle beam device includes a transmitted signal conversion member for emitting secondary charged particles by the collisions of charged particles transmitted through a sample, and a detector for attracting and detecting the secondary charged particles emitted from the transmitted signal conversion member. Further, the objective lens for focusing the primary charged particles is designed to leak the focusing magnetic field toward the sample.

According to such construction, the secondary charged particles emitted from the surface of the sample are converged by the focusing function of the objective lens, which makes it possible to prevent the secondary charged particles from mixing into the signal based on the dark field signal particles transmitted through the sample.

More detailed embodiments or other constructions of this invention will be described in detail in the following Detailed Description of the Preferred Embodiments.

BRIEF DESCRIPTION OF THE DRAWINGS

FIGS. 8A, 8B, and 8C illustrate variations of the dark field images when the lower limit of the detected scattering angle is varied, in which FIG. 8A shows a dark field image of scattered electrons in the scattering angle of more than 2°, FIG. 8B a dark field image in the scattering angle of more than 6°, and FIG. 8C a dark field image in the scattering angle of more than 8°;

FIG. 14 illustrates an example in which carbon nanotubes are observed by using the STEM, wherein FIG. 14A shows a secondary electron image, FIG. 14B a bright field signal image, and FIG. 14C a dark field signal image;

FIG. 17 illustrates an example in which the dispersed state of a metal catalyst is observed by using the STEM, wherein FIG. 17A shows a dark field signal image in which the bright field signal (inverted signal) is mixed into the dark field signal, and FIG. 17B shows a dark field signal image in which the mixture of the bright field signal is prevented;

DETAILED DESCRIPTION OF THE PREFERRED EMBODIMENTS

Embodiment 1

The concrete constructions and effects of the present invention will now be described in conjunction with the accompanying drawings.

Figure 2:
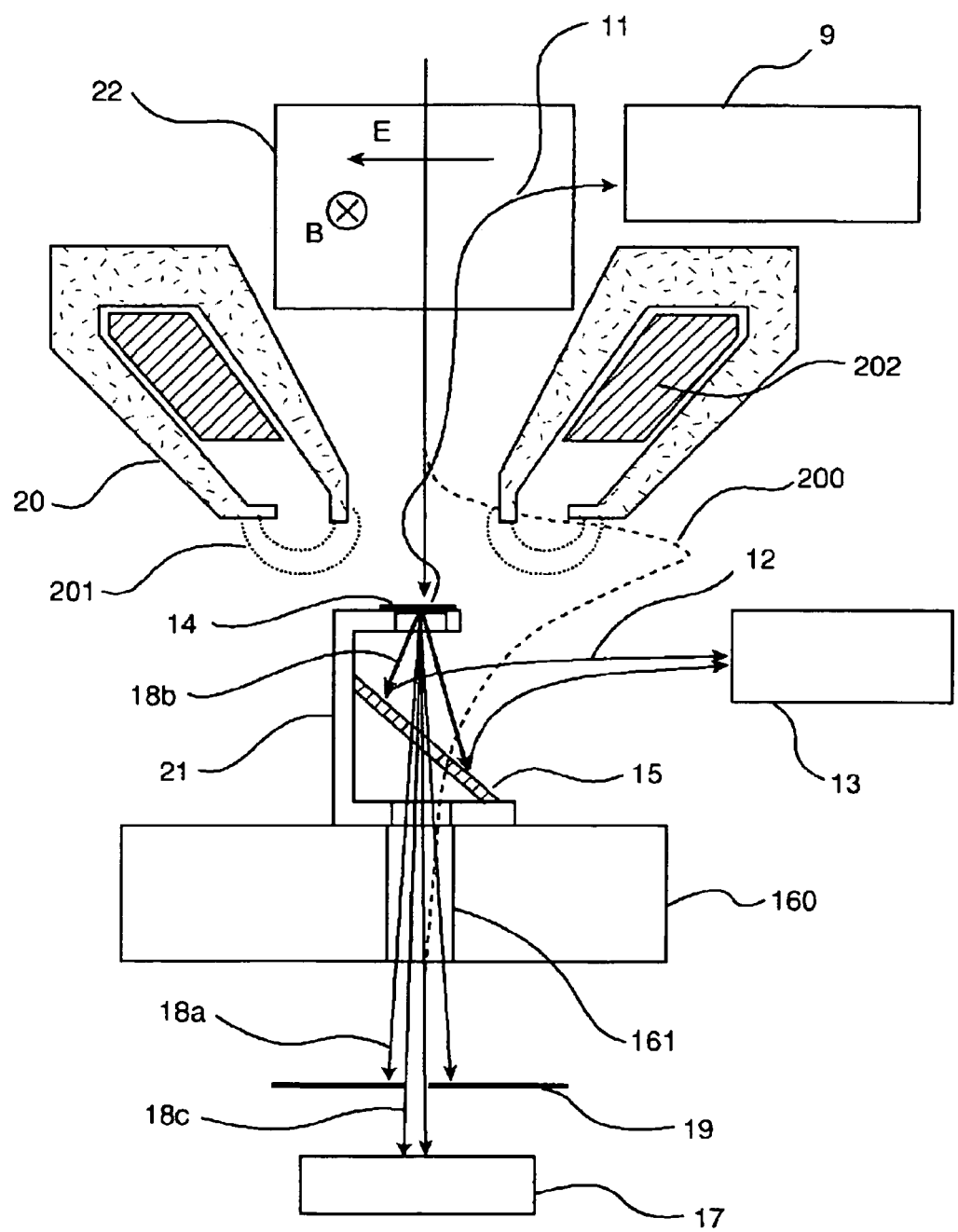
FIG. 2 illustrates a schematic construction of basic part of the present invention.

First, this embodiment provides, in order to detect the dark field transmitted signal particles, a transmitted signal conversion member 15 (a member that emits secondary signal particles by the collisions of the charged particles, made of a metal in general) with a through hole passing through in the center thereof, disposed under the thin film sample 14, as shown in FIG. 2. The bright field signal particles 18a transmitted through the thin film sample 14 without being scattered within the sample pass through this through hole, and do not collide against the transmitted signal conversion member 15 accordingly. On the other hand, the dark field signal particles 18b scattered within and transmitted through the sample collide against the transmitted signal conversion member 15 to emit the secondary signal particles 12. The secondary signal particles 12 are attracted by an electric field by the secondary signal detector 13 disposed below the objective lens, and are detected by the secondary signal detector 13. Therefore, the signal detected by the secondary signal detector 13 generates the dark field signal image as shown in FIG. 3C.

In order to prevent the secondary signal detector 13 disposed below the objective lens from detecting the secondary signal particles emitted from the surface of the sample, this embodiment provides an objective lens 20 with a shape such that the pole pieces facing the sample. In this objective lens, a magnetic flux 201 generated from the pole pieces by the magnetization of an exciting coil 202 is present on the side of the sample. Accordingly, a magnetic field distribution 200 on the optical axis becomes comparably large on the surface of the sample.

Therefore, the secondary signal particles 11 emitted from the surface of the sample are converged strongly by the magnetic field of the objective lens to advance toward the source of charged particles (above the objective lens). Accordingly, the secondary signal detector 13 placed below the objective lens will not substantially detect the secondary signal particles 11. An orthogonal electromagnetic field generator 22 placed above the objective lens 20 deflects the secondary signal particles 11 advancing above the objective lens, and the secondary signal particles 11 are detected by a secondary signal detector 9.

This objective lens is configured in such a manner that the gap formed by the inner and outer pole pieces faces the sample (this gap leaks the magnetic field to form the lens field of the objective lens), and the maximum focusing magnetic field by the objective lens is located nearer a sample mount 21 than the lower part of the inner pole piece.

On the other hand, in the objective lens as shown in FIG. 2, the magnetic field of the objective lens 200 rapidly weakens as it goes further apart from the bottom of the objective lens, and extremely at the position of the transmitted signal conversion member 15. Therefore, the secondary signal particles 12 emitted from the transmitted signal conversion member 15 are attracted by an extraction field of the secondary signal detector 13 below the objective lens, and are detected by the secondary signal detector 13, without being substantially affected by the magnetic field 200 of the objective lens. Therefore, the characteristic construction as shown in FIG. 2 makes it possible to detect the secondary signal particles emitted from the surface of the sample and the dark field signal particles respectively, separately from the bright field signal particles.

Further, the objective lens as shown in FIG. 2 forms a strong magnetic field 200 for focusing the primary beams right under the objective lens, and the magnetic field sharply weakens at a remote position from the objective lens. Therefore, even if the transmitted signal conversion member 15 is placed right under the sample which is placed in a strong focusing magnetic field, it is possible to guide the secondary charged particles emitted from the transmitted signal conversion member 15 to the secondary signal detector 13 with a high efficiency.

In the construction of this embodiment, if the magnetic field strength of the objective lens is too weak on the surface of the sample, the secondary signal particles emitted from the surface of the sample can not be sufficiently converged by the magnetic field of the objective lens, and therefore, part of them will be detected mixedly with the secondary signal particles emitted from the transmitted signal conversion member 15. On the other hand, if the magnetic field strength at the transmitted signal conversion member 15 is too strong, the secondary signal particles 12 emitted from the transmitted signal conversion member 15 will be converged by the magnetic field of the objective lens, and they will not be detected with a satisfactory efficiency by the secondary signal detector 13, which is provided to detect them. The inventor examined these circumstances through experiments, and found as a result that to dispose the surface of the sample at the position of the magnetic field strength being more than 20% of the peak value of the magnetic field of the objective lens on the optical axis, and to dispose the transmitted signal conversion member 15 at the position of the magnetic field strength being less than 20% of the peak value thereof will make it possible to effectively separate the secondary signal particles emitted from the surface of the sample and the secondary signal particles emitted from the transmitted signal conversion member 15, and to efficiently detect the secondary signal particles emitted from the transmitted signal conversion member 15.

According to the structure of the objective lens and the disposition of the transmitted signal conversion member 15, the magnetic field generated from the pole pieces rapidly attenuates as the working distance increases. Accordingly, it becomes possible to dispose the transmitted signal conversion member 15 in a comparably short working distance, to shorten the probe size of the primary charged particle beam that scans the sample, and also to detect the dark field signal with a high efficiency, thus enhancing the resolution of the dark field signal image.

If the sample and the transmitted signal conversion member are disposed under an in-lens type objective lens, since a strong magnetic field is also present under the sample, the signal from the transmitted signal conversion member cannot be detected efficiently, and the effect of this embodiment cannot be achieved, although a high-resolution probe can be attained.

As another means for detecting only the dark field signal particles, the transmitted signal conversion member 15 can be configured by a scintillator that emits light by the collisions of charged particles. In this case, in replacement for the secondary signal detector 13 under the objective lens is provided a photo-multiplier that directly detects a light and converts it into an electric signal. This method corresponds to converting the dark field transmitted signal particles into an optical signal, instead of converting into the secondary signal particles.

Figure 3:
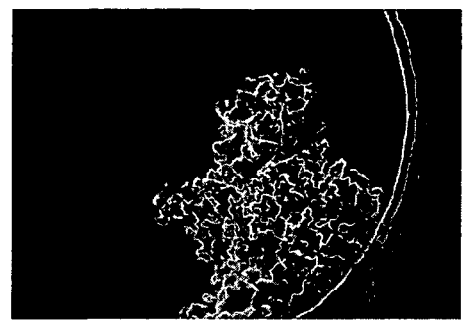
FIG. 3A illustrates an image of the secondary signal particles emitted from the surface of the sample.
FIG. 3B a bright field signal image of the signal particles transmitted through the sample without being scattered within the sample.
FIG. 3C a dark field signal image of the signal particles scattered within and transmitted through the sample.
Figure 3:
Figure 3:
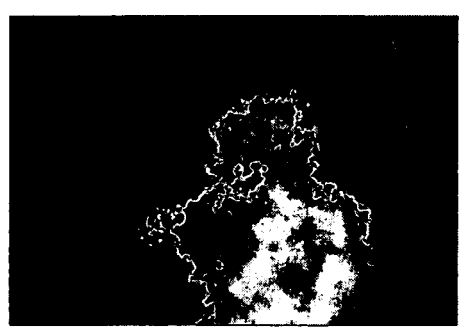

In order to detect the bright field transmitted signal particles separately from the dark field transmitted signal particles, the embodiment provides an aperture 19 and a transmitted signal detector 17 under the sample stage 160. The bright field transmitted signal particles 18a having passed through the through hole 161 of the sample stage 160 are further selected by the aperture 19 into optimum bright field signal particles 18c, which are detected by the transmitted signal detector 17. Therefore, according to the characteristic construction of this invention, it becomes possible to detect the secondary signal particles 11 emitted from the surface of the sample, the dark field signal particles 18b, and the bright field signal particles 18c selected to the optimum contrast condition, separately and simultaneously. The images as shown in FIG. 3 are those of the signals detected in this manner.

Figure 1:
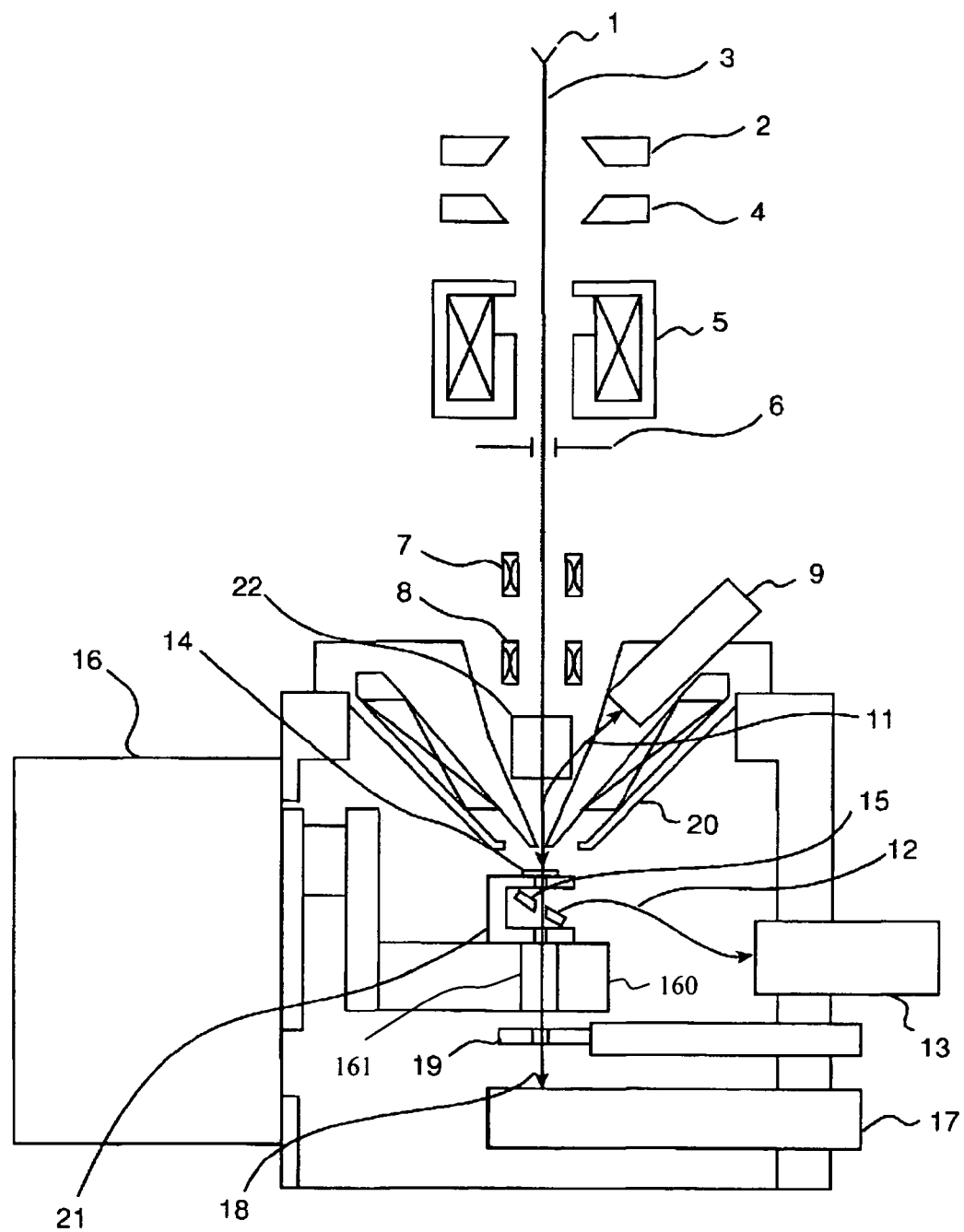
FIG. 1 illustrates a schematic construction of a scanning electron microscope as an example of the present invention.

FIG. 1 illustrates a schematic construction of the scanning electron microscope as an example of the present invention. A primary charged particle beam 3 is emitted from a cathode 1 by a voltage (not illustrated) applied between the cathode 1 and a fist anode 2, and is accelerated by a voltage Vacc (not illustrated) applied to a second anode 4, to advance to the following-stage lens system. The primary charged particle beam 3 is then converged by a first converging lens 5. An aperture 6 of the objective lens restricts the irradiation angle of the beam 3. The beam 3 is scanned two-dimensionally on the sample 14 by means of two-stage deflection coils 7 and 8.

The secondary signal particles 11 emitted from the irradiation point of the primary charged particle beam on the surface of the sample are wound up by the magnetic field that the objective lens 20 generates, and advance above the objective lens (toward the source of the charged particles). The secondary signal particles 11 are separated in trajectory from the primary charged particle beam 3 by the orthogonal electromagnetic field generator 22, and are detected by the secondary signal detector 9.

On the other hand, among the signal particles transmitted through the thin film sample 14 mounted on the sample mount 21, the dark field transmitted signal particles (18b: FIG. 2) scattered within the sample are irradiated on the transmitted signal conversion member 15 provided under the sample 14. Since it is configured with a material (metal in general) that emits secondary signal particles by the collisions of charged particles, the transmitted signal conversion member emits the secondary signal particles proportional to the quantity of the signal particles caused by the collisions of the transmitted signal particles. The secondary signal detector 13 placed below the objective lens 20 detects the secondary signal particles 12 emitted from the transmitted signal conversion member 15. The transmitted signal conversion member 15 is provided with an opening that the bright field signal particles (18a: FIG. 2) which are transmitted through the sample without being scattered within the sample can pass through.

Thus, the secondary signal particles 12 emitted from the transmitted signal conversion member 15 possess only the information of the dark field signal particles. The bright field transmitted signal particles 18a having passed through the opening of the transmitted signal conversion member 15 pass through the opening of the sample stage 160, and are detected by the transmitted signal detector 17 furnished below the sample stage 160. Between the sample stage 160 and the transmitted signal detector 17 is disposed the aperture 19. The aperture 19 selects only the bright field transmitted signal particles giving the optimum contrast, from the transmitted signal particles passing through the sample stage 160, and the transmitted signal detector 17 detects the bright field transmitted signal particles selected by the aperture. The aperture 19 possesses a plurality of openings of which diameters are different.

Further, in the above construction of this embodiment, the sample is placed in a strong magnetic field of the objective lens. Therefore, the charged particle beam device of the present invention achieves a high resolution equivalent to that attained by the charged particle beam device adopting an in-lens type objective lens in which the sample is placed in the magnetic field of the objective lens in the same manner. Also, the device of the present invention can adopt a stage for a large sample, whereas it is difficult for the device adopting an in-lens type objective lens to realize such a large sample.

The transmitted signal conversion member 15 may be configured with a scintillator (material that emits light by the collisions of charged particle) having the same shape. The information of the dark field signal particles is converted into the information of light by the scintillator. In this case, a means for converting a light into an electric signal (for example, photo-multiplier) is provided at a position where the light emitted from the transmitted signal conversion member can be detected.

Figure 4:
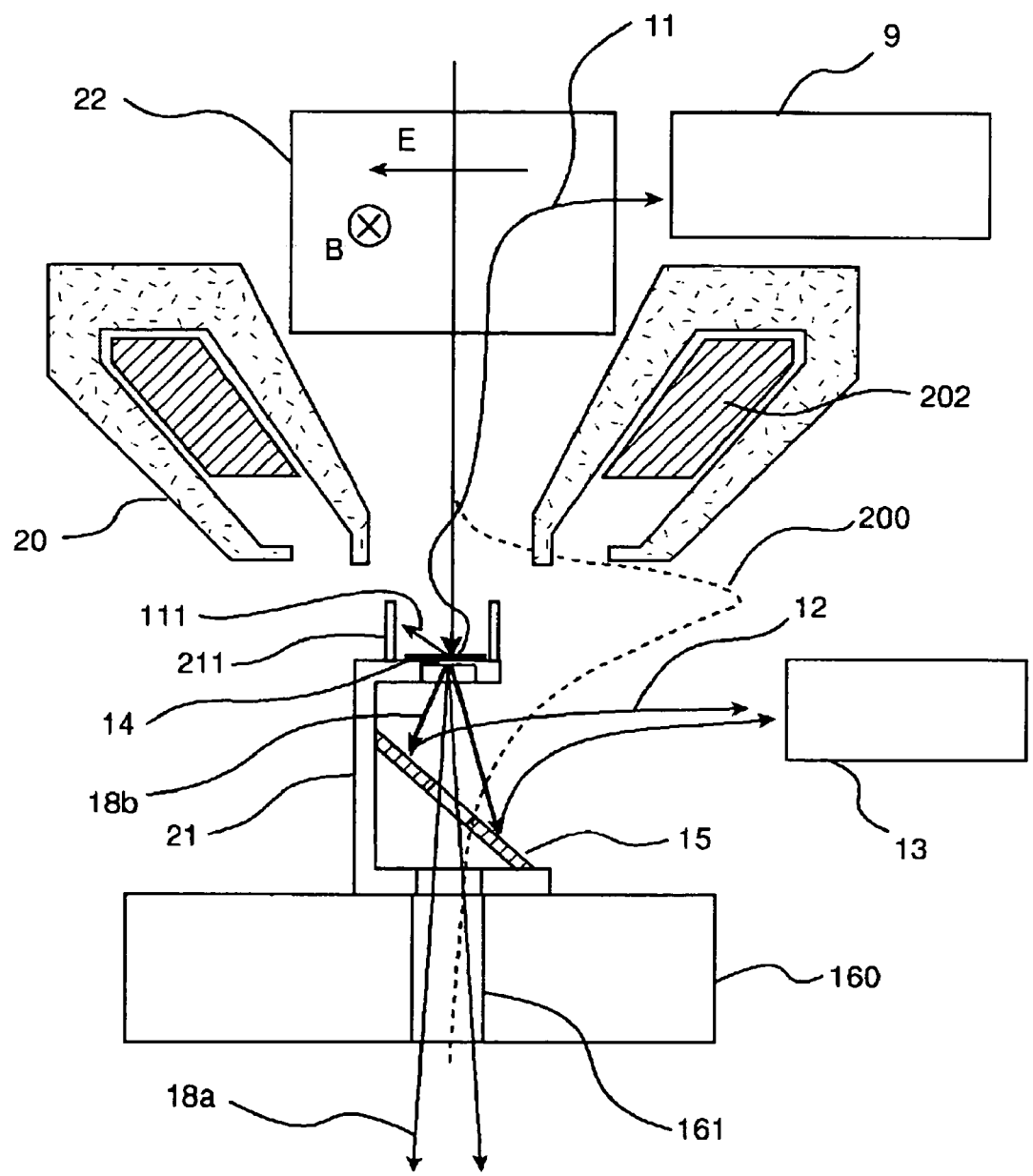
FIG. 4 illustrates an example of a sample mount that prevents the mixture of high-energy secondary signal particles (backscattered signal particles) emitted from the surface of the sample.
Figure 5:
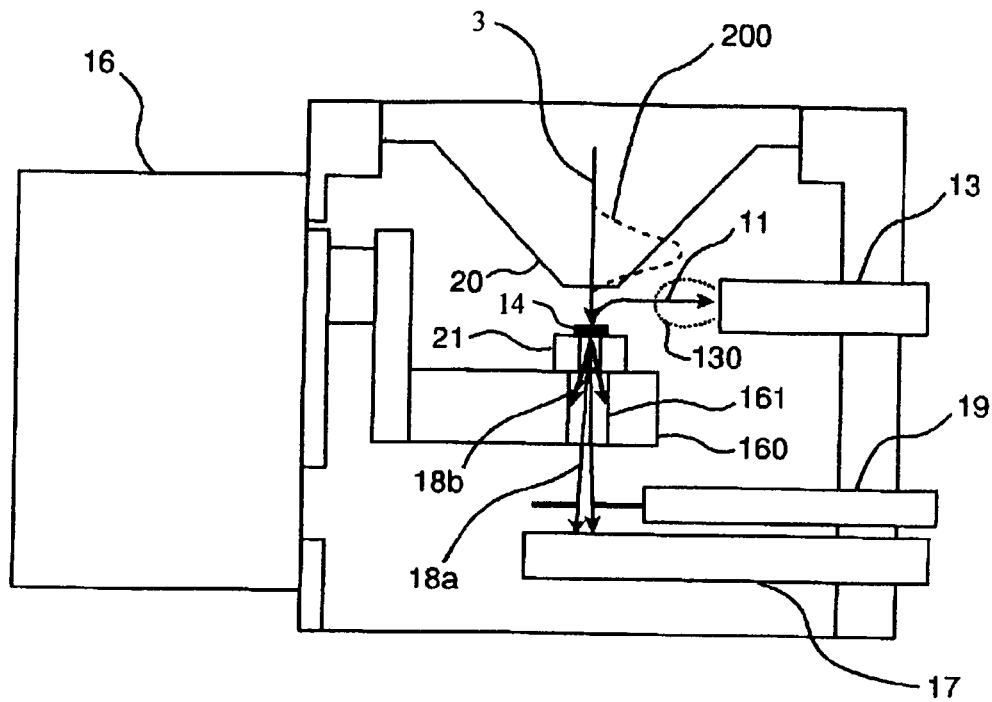
FIG. 5 illustrates a schematic construction of the conventional technique that detects the transmitted signal particles, in the charged particle beam device having a large sample stage.
Figure 6:
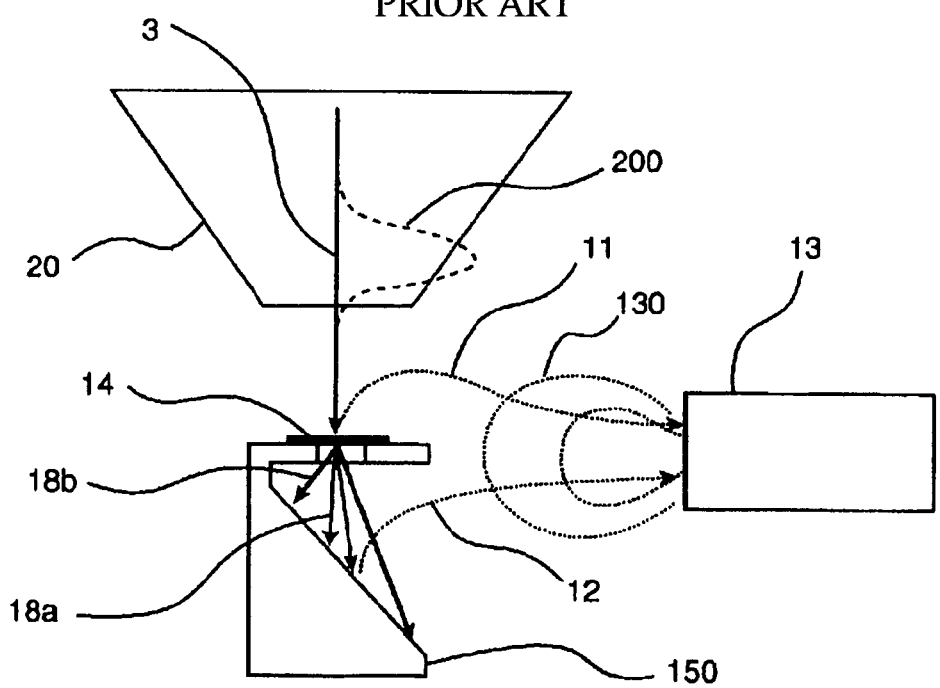
FIG. 6 illustrates another schematic construction of the conventional technique that detects the transmitted signal particles.

FIG. 4 illustrates an example of the sample mount, which is suited to the object of the present invention. Almost all of the low-energy secondary signal particles 11 emitted from the surface of the sample are converged by the magnetic field of the objective lens, to advance above the objective lens. On the other hand, high-energy backscattered signal particles 111 emitted from the surface of the sample at a shallow angle do not advance above the objective lens. Part of such signal particles are detected by the secondary signal detector 13, which deteriorates the informational quality of the dark field transmitted signal particles. To solve this condition, this embodiment provides the sample mount with a cylindrical wall 211, as shown in FIG. 4, which obstructs the high-energy backscattered signal particles 111 emitted from the surface of the sample at a shallow angle.

According to the construction of this embodiment thus described, it becomes possible to achieve a high-contrast image so as to meet a desired condition, by separately detecting the signal particles emitted from the surface of the sample, the bright field signal particles transmitted through the sample without being scattered within the sample, and the dark field signal particles scattered within and transmitted through the sample.

Embodiment 2

In order to attain a high-contrast dark field image, it is very important to control the detected scattering angle in accordance with the sample. However, in the scanning electron microscope capable of observing a large sample, it is impossible to place a convergent lens under the sample as in the transmission electron microscope. Therefore, there arises a problem that it is impossible to control (optimize) the scattering angle of the dark field signal.

An embodiment of the charged particle beam device will be described which is suitable for detecting the dark field signal particles scattered within and transmitted through the sample separately from the other signal particles, and for controlling the detected scattering angle of the dark field signal in accordance with the sample.

Further, an embodiment of the charged particle beam device will be described which is suitable for detecting the dark field signal with an extremely high efficiency when it is used under such a condition that the observation material is stationary and the detected scattering angle is constant.

According to this embodiment, firstly, the charged particle beam device includes a transmitted signal conversion member for emitting secondary charged particles by the collisions of charged particles transmitted through a sample, the transmitted signal conversion member being provided with an opening of a size through which the transmitted charged particles can pass, and a power supply for applying zero voltage or a positive voltage to the opening.

Secondly, the charged particle beam device includes a transmitted signal conversion member for emitting secondary charged particles by the collisions of charged particles transmitted through a sample, the transmitted signal conversion member being provided with two electrodes having openings for the transmitted charged particle beams to pass through, and a detector for detecting the secondary charged particles between the two electrodes.

According to the above constructions, it becomes possible to separate the dark field transmitted signal particles and the bright field transmitted signal particles, to control the detected scattering angle of the dark field signal, and to detect the dark field signal with a high efficiency. This embodiment will be described with the drawings.

Figure 7:
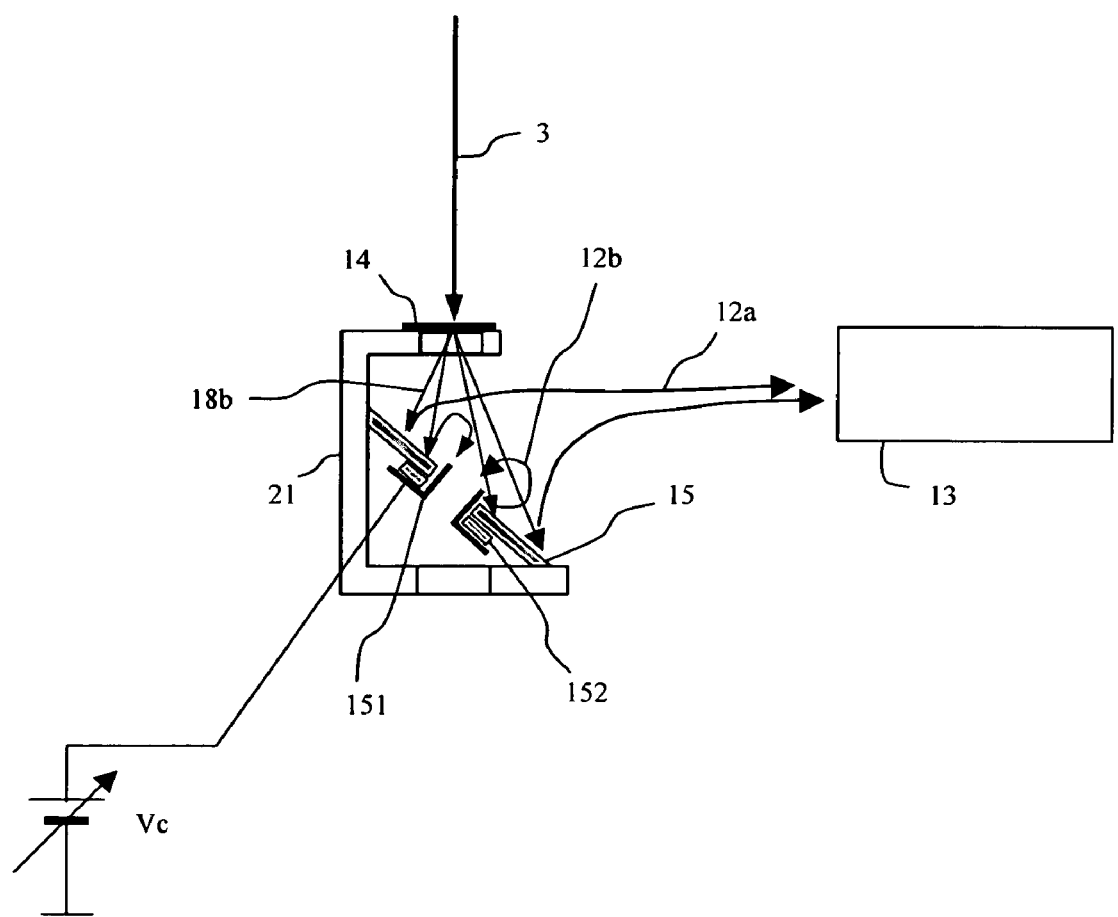
FIG. 7 illustrates an example that controls the detected scattering angle of the dark field signal.

FIG. 7 illustrates an example that controls the detected scattering angle of the dark field signal. In this example, an electrode 151 electrically insulated with an insulator 152 is implanted in the opening, and a positive voltage Vc is applied to the electrode 151 from the power supply. The power supply is able to apply a voltage ranging from zero to a given positive voltage.

Figure 8:
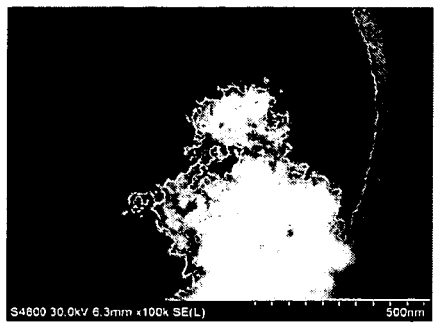
Figure 8:
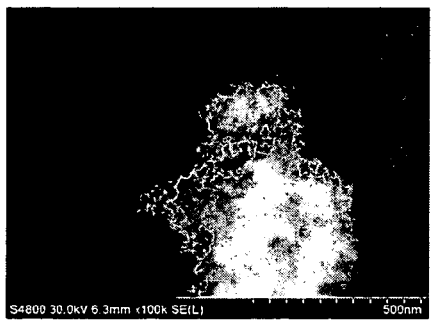
Figure 8:
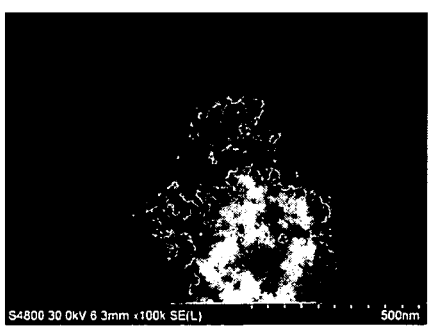

As the dark field signal particles 18b collide against the transmitted signal conversion member 15, secondary signal particles 12a are emitted. However, since secondary signal particles 12b emitted near the electrode 151 are attracted to the electrostatic field by the positive voltage applied to the electrode 151, the secondary signal particles 12b are not detected by the detector 13. If the voltage applied to the electrode 151 is raised, the secondary signal particles are attracted to the electrode 151 in a wider area from the center of the electrode 151. That is, by controlling the positive voltage applied to the electrode 151, the lower limit of the scattering angle of the dark field signal detected by the detector 13 can be controlled. Therefore, as the voltage applied to the electrode 151 is gradually raised, the contrast of the dark field image is varied as FIG. 8A, FIG. 8B, and FIG. 8C, for example. Accordingly, the operator is able to attain the optimum contrast by controlling the voltage to the electrode 151, while viewing the dark field image.

Figure 9:
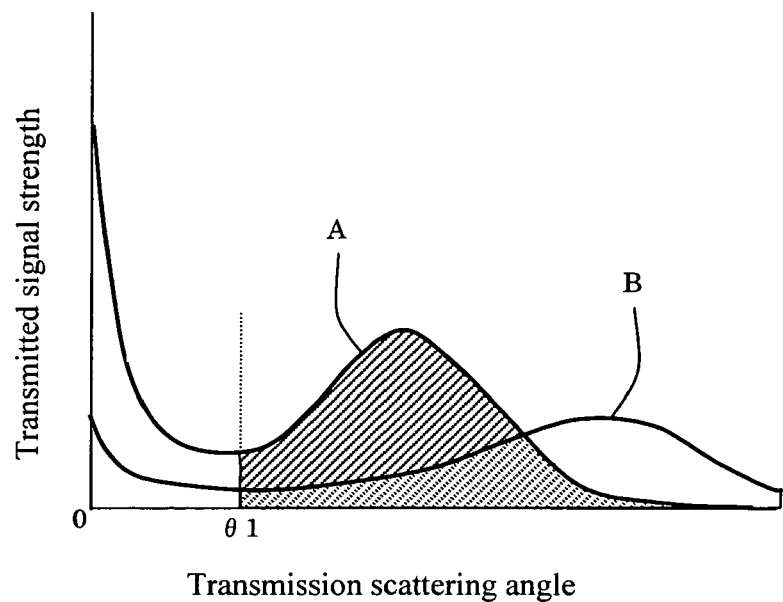
FIG. 9 typically illustrates the relations between the signal strength and the scattering angle of the transmitted electrons in different materials.
Figure 9:
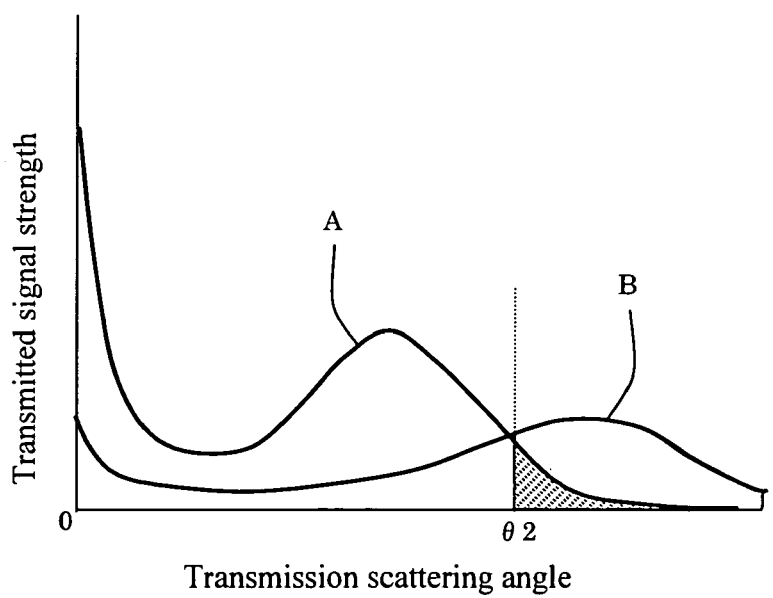

In regard to the detection of the dark field signal, it is known that to optimize the detected scattering angle (especially, internal angle) in accordance with the material of the sample (observational object) is extremely important. The reason for the above will be explained with FIG. 8 and FIG. 9. FIG. 9 typically illustrates the relation between the signal strength and the scattering angle of the transmitted electrons with regard to different materials (in atomic number and thickness of the sample). In the drawing, the graph A and the graph B show the case of a light element (or thin sample) and the case of a heavy element (or thick sample), respectively. If the thickness of the sample is uniform, the graph A and the graph B each depend on the differences of the atomic number. In FIG. 9, when the dark field signal of the scattering angle being more than θ1 is detected, the signal sum of the graph A is larger than that of the signal B (hatched signal area), and the dark field image of the signal area A gives a brighter contrast than that of the signal area B. When the lower limit of the detected scattering angle is θ2, the signal sum of the heavier element B is larger than that of A, and the dark field image of the signal area B gives a brighter contrast than that of the signal area A. Thus, in view of the relation between the signal strength and the detected scattering angle determined by the material of the sample, by selecting a suitable detected scattering angle, it will be possible to attain a dark field image of an intended contrast.

FIGS. 8A–8C illustrate variations of the dark field images when the lower limit of the detected scattering angle is varied, with regard to a catalyst sample composed of a light element (carbon) and a heavy element (platinum: fine particles). In FIG. 8A, under the condition (a) of a small-detected scattering angle (more than 2°), the contrast of the light element (carbon) is too intense, and the heavy element (platinum) can hardly be seen. On the other hand, in FIG. 8c, under the condition (c) of a large-detected scattering angle (more than 8°), the signal quantity of carbon is suppressed, and the contrast of platinum particles becomes distinct.

According to this embodiment, the control of the voltage applied to the electrode 151 will easily achieve a dark field image having the detected scattering angle optimized. Here, instead of controlling the voltage applied to the electrode 151, a plurality of electrodes having different opening diameters for applying different voltages may be disposed inside the openings of the transmitted signal conversion member 15 to apply the voltages according to the detected scattering angles to the electrodes each.

Figure 10:
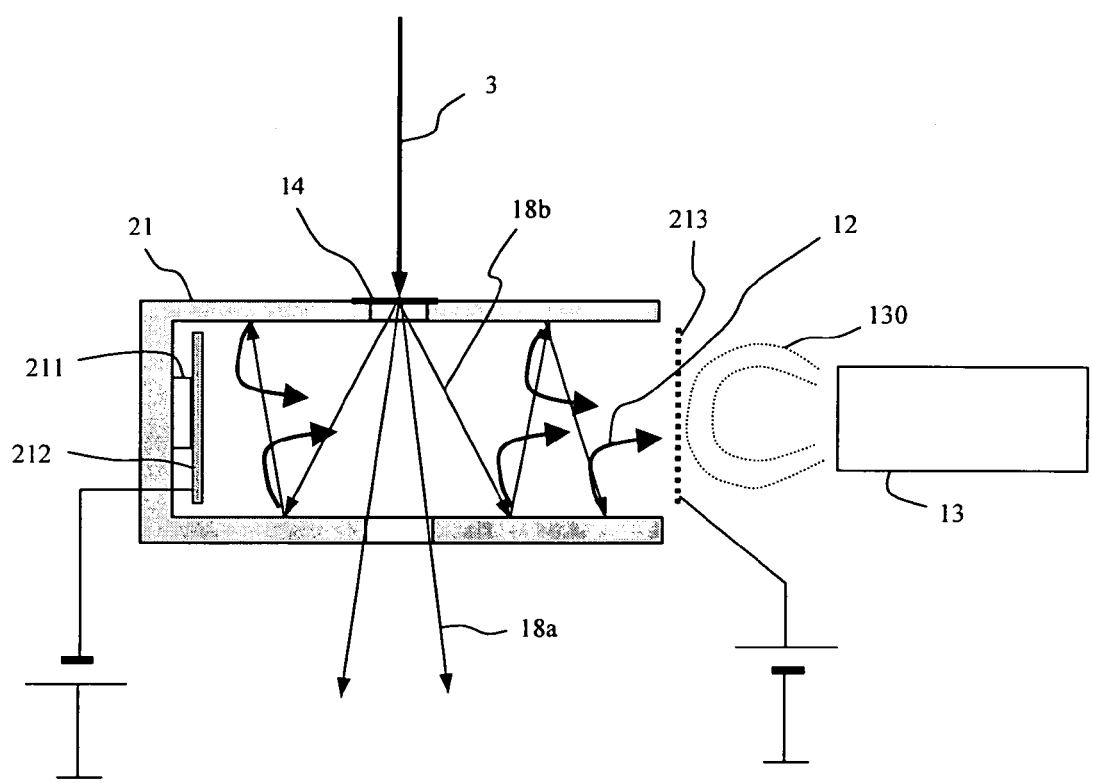
FIG. 10 illustrates an example that amplifies the dark field signal.

FIG. 10 illustrates an example that amplifies the dark field signal. The sample mount 21 functions as the transmitted signal conversion member 15 as it is. It is formed as a double structure such that two electrodes each having the opening for the electron beams passing through are laminated along the optical axis direction of the electron beams, so as to prompt multiple scatterings.

And, an electrode 212 is mounted by means of an insulator 211 at a position facing the signal detector 13, and a negative voltage can be applied to the electrode 212.

After being transmitted through the thin film sample 14, the dark field signal particles 18b having large scattering angles and not passing through the lower opening of the transmitted signal conversion member 15 collide several times against the transmitted signal conversion member 15 inside the sample mount 21 (multiple scatterings). At each time of the collisions, the transmitted signal conversion member 15 emits secondary signal particles, thus amplifying the signal electrons. Since the secondary signal particles are deflected toward the detector 13 due to the negative voltage applied to the electrode 212, the detector 13 is able to efficiently detect the secondary signal particles.

Further, a mesh-form electrode 213 that charged particles can pass through is disposed on the side of the detector 13, and the positive voltage is applied to the electrode 213. This embodiment uses both of the mesh-form electrode 213 and the electrode 212 having the negative voltage applied to thereby guide the secondary electrons toward the detector. However, it is not restricted to this example, and it may be configured with either of electrodes 213, 212. If the deviation of axis of the primary electron beams is permissibly small, it may be configured so as to cause only the electrostatic field generated by the secondary signal detector 13 to attract the secondary electrons toward the detector.

Figure 11:
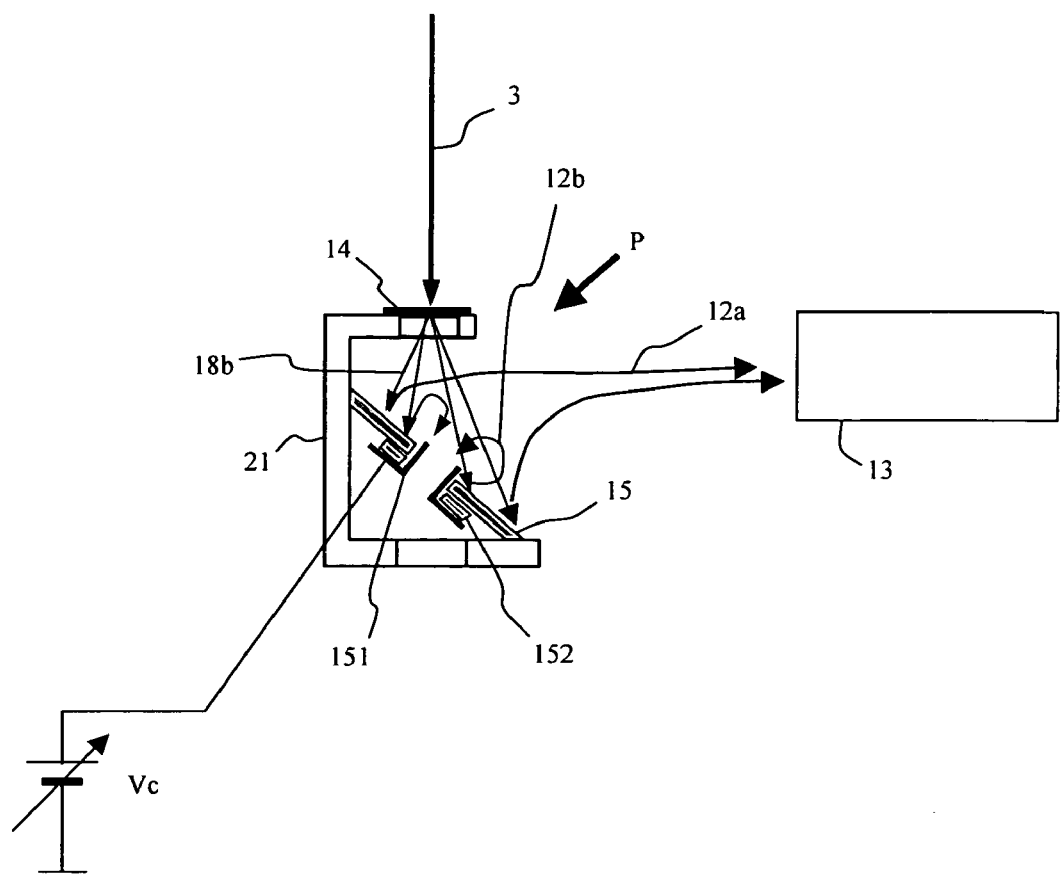
FIG. 11 illustrates an example of the shape of a transmitted signal conversion member.
Figure 11:
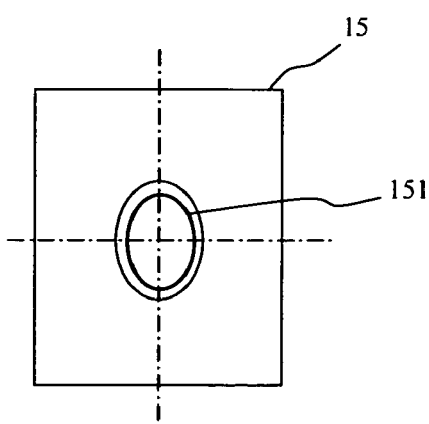

FIG. 11A illustrates an example of the shape of the transmitted signal conversion member 15. The transmitted signal conversion member 15 is disposed slant against the primary charged particle beam 3. The opening bored through in the transmitted signal conversion member 15 is formed elliptic as shown in FIG. 11B, so as to be circular when the opening is viewed along the primary charged particle beam 3. The electrode 151 implanted in the opening is also formed elliptic.

Figure 12:
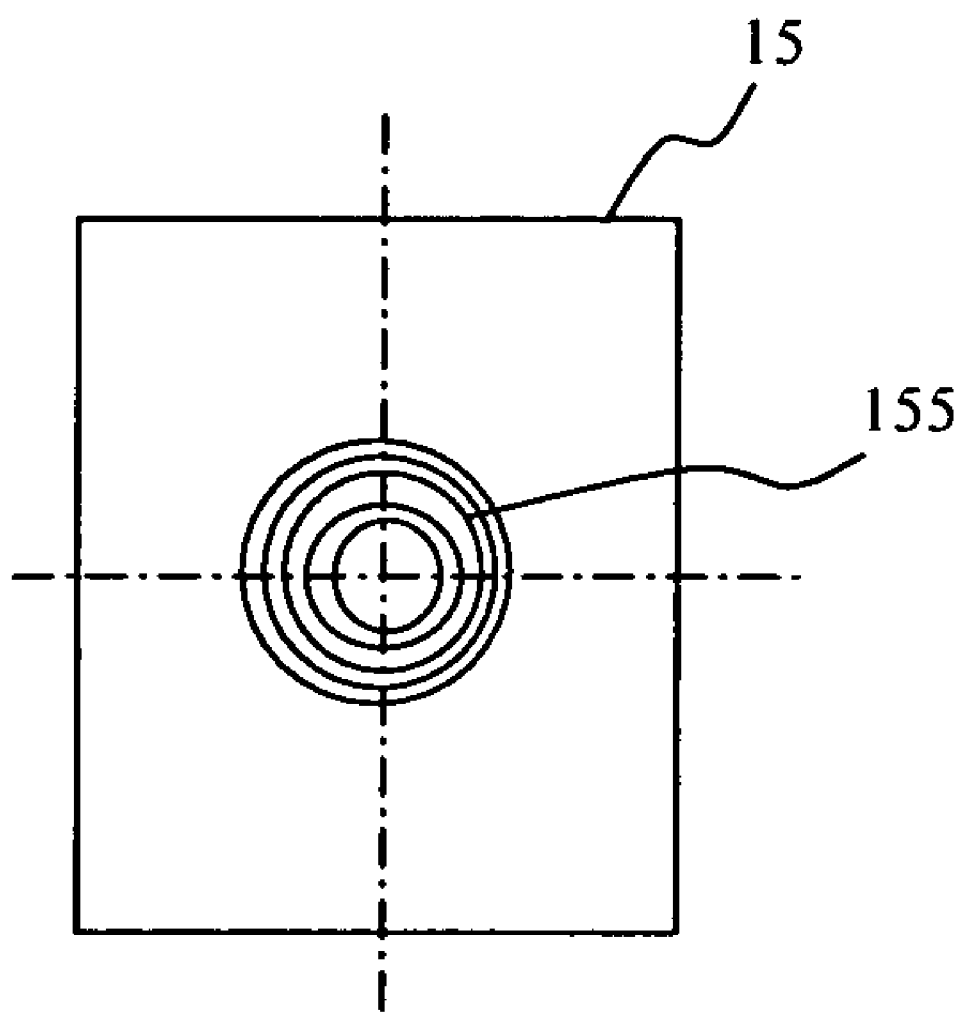
FIG. 12 illustrates another example of the shape of a transmitted signal conversion member.

FIG. 12 illustrates another example of the shape of the transmitted signal conversion member 15. In FIG. 12, a plurality of conductive patterns are formed concentrically at the center of the conversion member, and positive voltages can be applied to the conductive patterns each. In this example, the operator is able to apply positive voltages to the conductive patterns in the order from the inner ring patterns to the outer, or in the reverse order thereof while confirming the contrast of the image. The secondary signal particles cannot escape from the area to which the positive voltage is applied. Accordingly, as the ring patterns where the positive voltages are applied are widened toward the outside, the restricted internal angle of the scattering angle becomes larger, which effects an appropriate condition for observing a heavier element.

Figure 13:
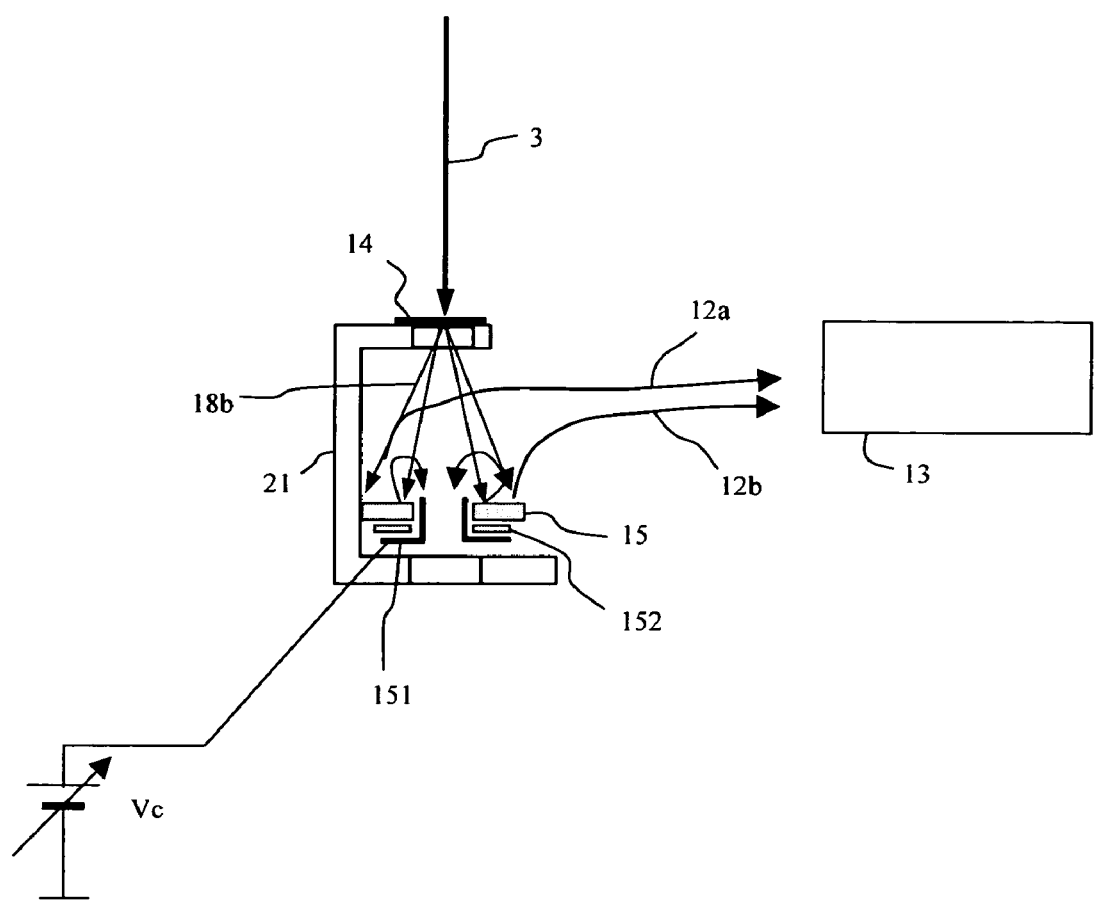
FIG. 13 illustrates an example in which the transmitted signal conversion member is disposed horizontally to the primary charged particle beams.

FIG. 13 illustrates an example in which the transmitted signal conversion member 15 is disposed horizontally, or perpendicularly to the primary charged particle beam 3. In this example, the shape of the opening of the transmitted signal conversion member and the shape of the electrode implanted in the opening can be made circular, which enhances the accuracy in controlling the detected scattering angle of the transmitted signal.

According to this embodiment, it is possible to detect the secondary signal particles emitted from the surface of the sample, the dark field signal particles scattered within and transmitted through the sample, and the bright field signal particles transmitted through the sample without being scattered therein individually separately. Further, since it is possible to control the detected scattering angle of the dark field signal particles, the operator is able to observe the sample image with the optimum contrast according to applications.

Embodiment 3

In this embodiment, the construction for observing the dark field signal image with a high contrast will be described. The scanning transmission electron microscope (STEM) forms a dark field image based on the electrons transmitted through a thin film sample with a large scattering angle. In order to selectively detect the transmitted electrons having a large scattering angle, the detector for detecting the dark field image is provided with an opening through which the electrons transmitted through the sample substantially along the optical axis of the electron beams can pass. Accordingly the detector does not detect such electrons passing substantially along the optical axis of the electron beams.

However, in the actual measurements arises a case that a signal having the inverted bright and dark contrasts of the bright field signal (dark field signal scattered with a small angle) is mixed into the dark field signal detected by the detector. This case will be explained with FIG. 14.

Figure 14:
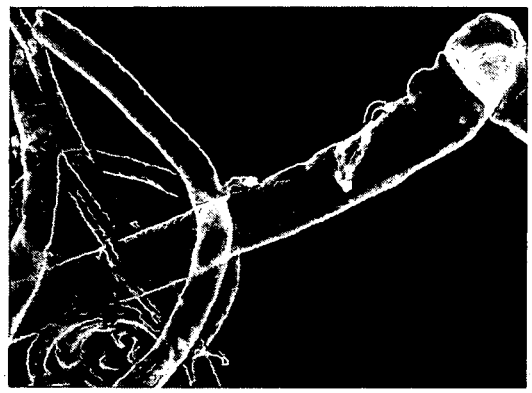
Figure 14:
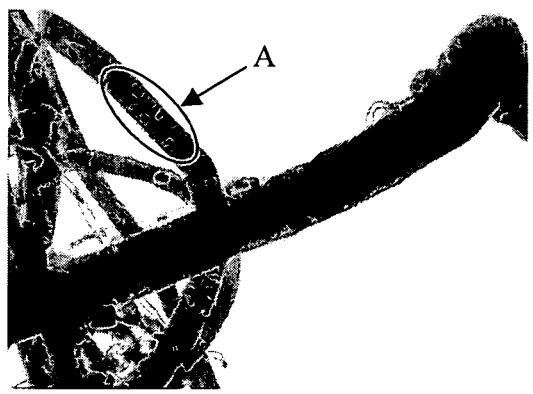
Figure 14:
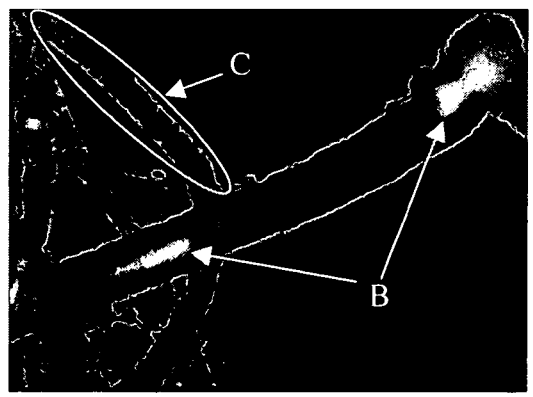

FIG. 14 illustrates an example in which carbon nanotubes are observed by using the STEM. The sample includes a metal catalyst (iron in this sample) for growing the nanotubes added in forming the sample. The point of evaluation in this sample lies in observing the shape of the grown carbon nanotubes in themselves, and understanding the dispersion state of the nanotubes and the catalyst.

FIG. 14A shows a secondary electron image based on the secondary electrons emitted from the surface of the sample. By this secondary electron image, the surface shape of the carbon nanotubes can be observed.

FIG. 14B shows a bright field signal image. This drawing gives clear observations of the shape (outer diameter, inner diameter) of the carbon nanotubes grown in a multi-layer. However, the dispersion state of the metal catalyst is buried in the diffraction contrast of the carbon nanotubes chained in a multi-layer (arrow A, linear contrast orthogonal to the longitudinal direction of the carbon nanotubes), and it cannot be observed distinctively.

FIG. 14C shows a dark field signal image. This drawing gives clear observations of comparably large particles (arrow B). However, it can be found that the information of the inverted bright field signal image in FIG. 14B appears in the area of the arrow C on the image.

It is conceivable that the information of the inverted bright field signal image is generated because the transmitted electrons and so forth collide against the optical elements provided near the optical path for the electron beams to thereby emit electrons, and the emitted electrons repeat collisions in the vacuum chamber until they reach the detector for the dark filed image. This situation will be explained with the construction as shown in FIG. 2 as an example. In FIG. 2, when the bright field signal particles 18a collide against the aperture 19 provided for observing the image of the bright field signal particles having passed through the transmitted signal conversion member 15, there is a possibility that the secondary signal particles emitted from the aperture 19 repeat collisions against the wall inside the sample chamber and the sample stage 160, and reach the secondary signal detector 13. The electrons which have reached the detector 13 bear the information of the bright field transmitted signal particles.

Thus, there occurs a case that the information of the inverted bright field signal is superposed on the dark field signal information, depending on the sample to be observed. This phenomenon is more conspicuous as the sample is a lighter element, because the original dark field signal information is less. Further, as the sample is more likely to create diffraction contrasts in the bright field signal image, the bright field signal information to be superposed increases. Accordingly, the phenomenon is likely to be conspicuous.

In this embodiment, a construction will be described which further enhances the contrast of the dark field image. The construction includes a power supply for applying a positive voltage to the aperture disposed between the sample and the detector for detecting the bright field signal particles. Also, will be explained an example in which this aperture is made in a double-layered structure.

According to the above constructions, it becomes possible to separate the dark field transmitted signal particles and the bright field transmitted signal particles, and to prevent the mixture of the bright field signal (inverted signal) while observing the dark field signal image. It also becomes possible to observe the images of the bright field signal and dark field signal at the same time with a high contrast.

Further, in case that the aperture is made in a double-layered structure, the secondary particles emitted from the aperture are absorbed into the aperture when the transmitted charged particles collide against the aperture. Therefore, it is possible to prevent the secondary particles from reaching the secondary signal detector.

As another construction, by providing the opening of the transmitted signal conversion member with a cylindrical structure functioning as a Faraday cup, it is possible to separate the dark field transmitted signal particles and the bright field transmitted signal particles, and to prevent the mixture of the bright field signal (inverted signal) while observing the dark field signal image.

The following describes the concrete construction and effect of the present embodiments with reference to the drawings.

Figure 15:
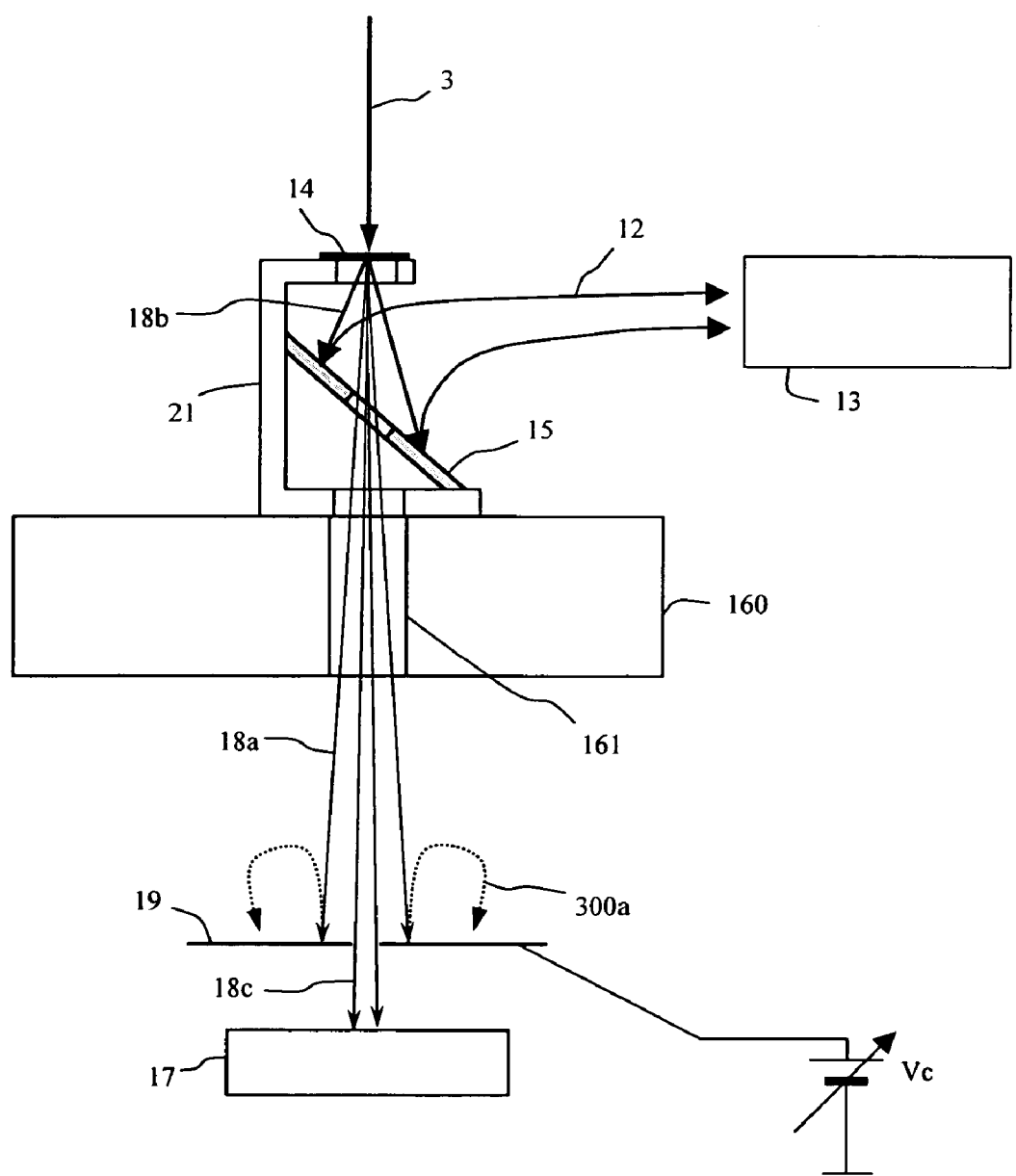
FIG. 15 illustrates an example in which a positive voltage is applied to the aperture.

FIG. 15 illustrates an embodiment in which a positive voltage is applied to the aperture 19. In this embodiment, the aperture 19 is electrically insulated from the enclosure, and the positive voltage Vc is applied to the aperture from the power supply. As the bright field transmitted signal particles 18a collide against the aperture 19, the aperture emits secondary signal particles 300a. However, since the positive voltage applied to the aperture 19 attracts the secondary signal particles 300a to the aperture, the particles 300a do not collide against the other members (stage, inner wall of the sample chamber, etc.). Consequently, the signal particles derived from the bright field transmitted signal particles 18a will not be detected by the secondary signal detector 13.

That is, when the dark field transmitted signal particles 18b transmitted through the thin film sample 14 with a large scattering angle collide against the transmitted signal conversion member 15, the conversion member 15 emits the secondary signal particles 12, and the secondary signal detector 13 detects only the secondary signal particles 12. Accordingly, it is possible to observe the dark field signal image with a high contrast.

Figure 16:
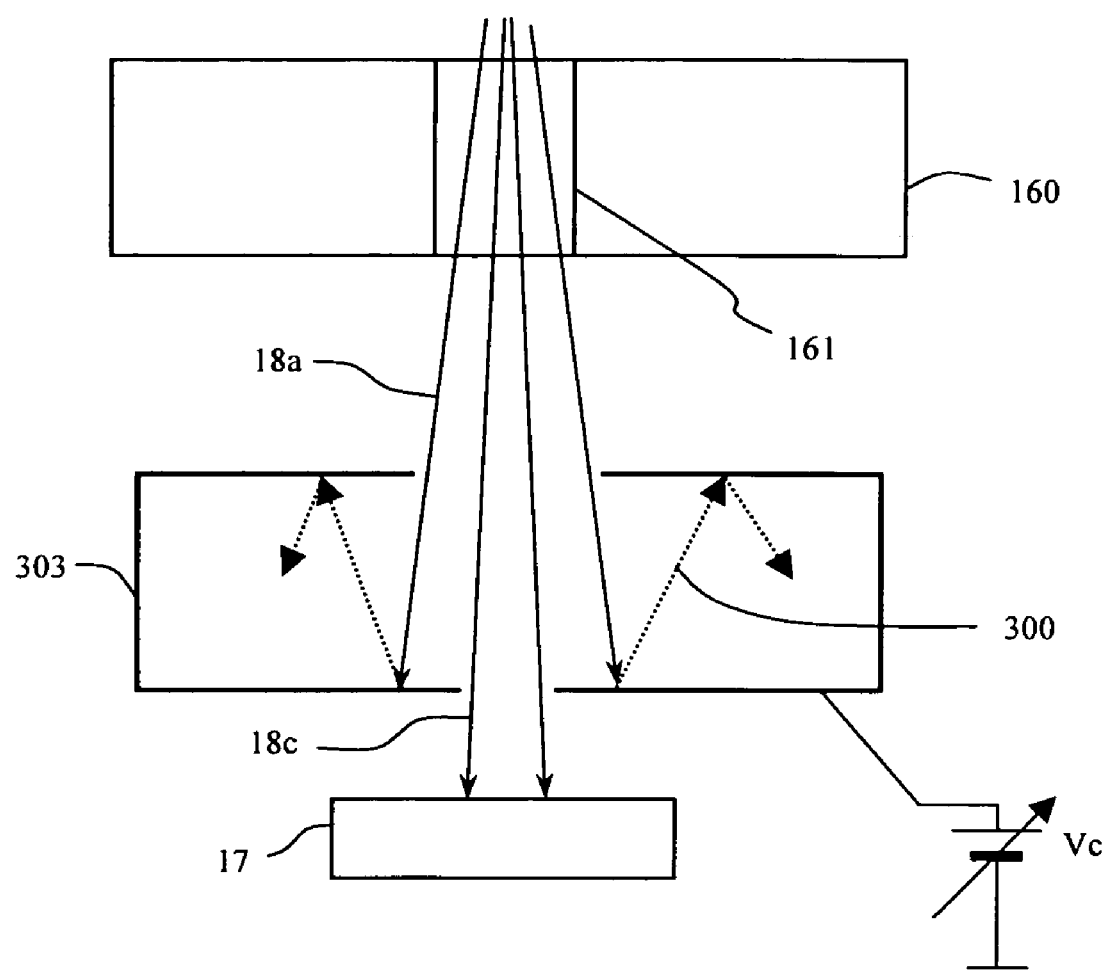
FIG. 16 illustrates an example that suppresses the detection of the secondary charged particles based on the bright field transmitted signal particles.

FIG. 16 illustrates another embodiment that suppresses the detection of the secondary signal particles derived from the bright field transmitted signal particles 18a. In this embodiment, the aperture provided above the transmitted signal detector 17 is a double-structured aperture 303. The lower bore of the double-structured aperture 303 splits the signal particles transmitted through the thin film sample into the bright field transmitted signal particles 18a and the bright field transmitted signal particles 18c optimized by the aperture. The bright field transmitted signal particles 18c optimized by the aperture reach the transmitted signal detector 17, where the signal particles 18c are detected and are observed as the bright field signal image. On the other hand, the bright field transmitted signal particles 18a generate secondary signal particles 300 inside the double-structured aperture 303. However, the secondary signal particles 300 attenuate while repeating collisions inside the aperture 303, to be absorbed into the double-structured aperture 303. As the result, the secondary signal particles 300 are not to be detected by the secondary signal detector 13.

Further, by insulating the double-structured aperture 303 from the enclosure and applying the positive voltage Vc to the aperture, it causes the effects of the absorption by the double-structured aperture and the attraction of the secondary signal particles 300 by the positive voltage. Thereby, it is possible to suppress the detection of the secondary signal particles derived from the bright field transmitted signal particles 18a with a high efficiency.

According to the above construction of this embodiment, it becomes possible to separate the dark field transmitted signal particles and the bright field transmitted signal particles and detect only the dark field signal particles among the signal particles transmitted through the sample, or to observe the bright field signal image and the dark field signal image at the same time.

The dark field signal image, as shown in FIG. 17A, is likely to produce an image (arrow A) such that the bright field (inverted) signal is mixed into the dark field signal, which makes it difficult to discriminate the metal catalyst from the diffraction contrast (derived from the bright field signal). Therefore, in the observation of the dark field signal image arises a case that the evaluation of the dispersion state of the catalyst becomes impossible.

On the other hand, according to this embodiment, as shown in FIG. 17B, it is possible to observe the image which detects only the dark field signal corresponding to the difference of compositions, which makes it possible to easily grasp the dispersion state of the metal catalyst.

Figure 18:
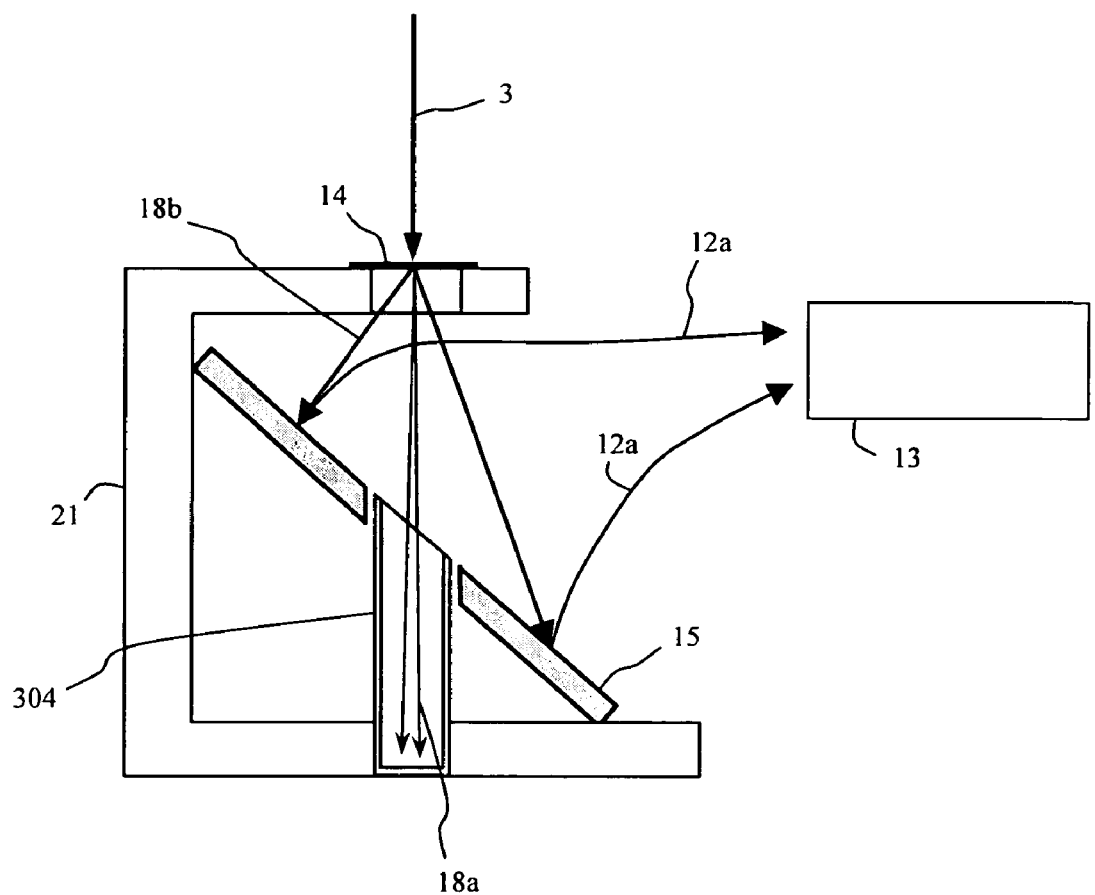
FIG. 18 illustrates an example in which a Faraday cup is provided to the opening of the transmitted signal conversion member.

FIG. 18 illustrates another embodiment. This example provides the opening in the center of the transmitted signal conversion member 15 on the sample mount 21 with a cylindrical structure 304 functioning as a Faraday cup. In this example, among the signal particles transmitted through the sample, the bright field signal particles 18a are absorbed by the cylindrical structure 304, and accordingly the signal particles 18a are not to be detected by the secondary signal detector 13.

Here, in order to make the cylindrical structure 304 function as a Faraday cup, the aspect ratio of the depth against the opening diameter is preferably more than 10. And, the thickness of the cylindrical structure 304 is preferably thin, in order to reduce the secondary signal that leaps out from the opening thereof.

Figure 17:
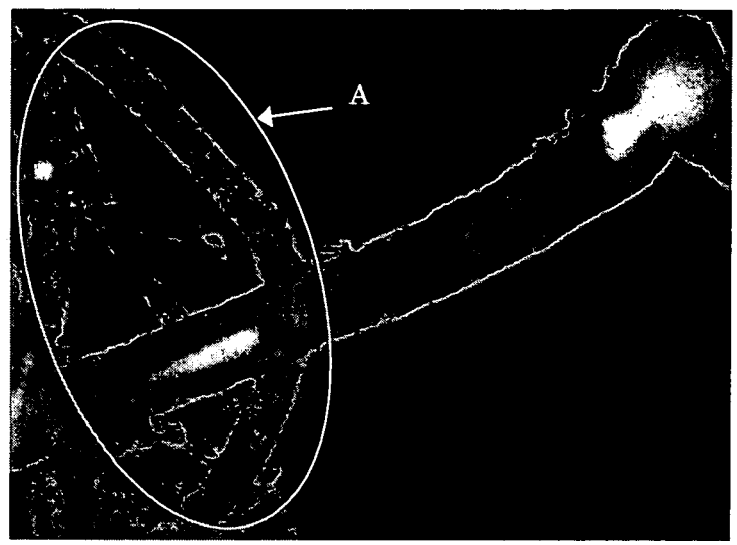
Figure 17:
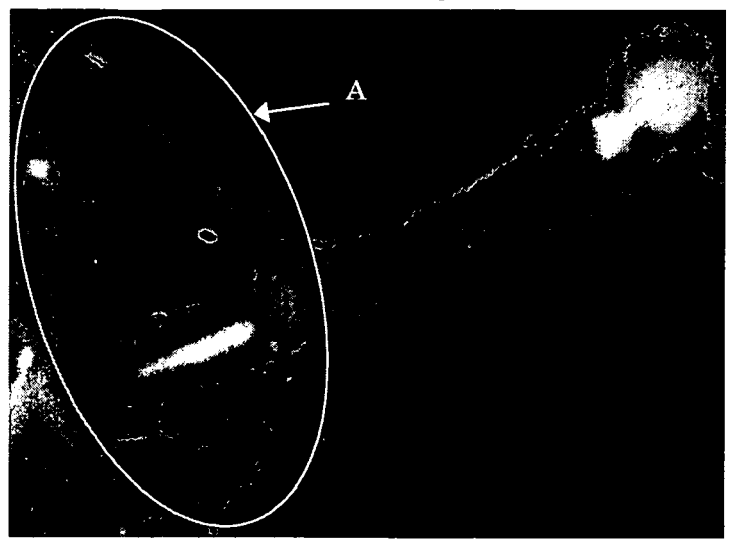

Since the construction of this example absorbs the bright field signal particles 18a by means of the cylindrical structure 304, it is impossible to observe the bright field signal image. However, it is possible to understand and evaluate the dispersion state of a heavy element existing inside a light element, as shown in FIG. 14 and FIG. 17, by capturing the secondary electron image having the information of surface (FIG. 14A) and the dark field signal image having the information of composition (FIG. 17B). In case of this example, such evaluation can be obtained by the transmitted signal conversion member 15 and the sample mount provided with the cylindrical structure 304, and a comparably low priced evaluation system can be provided.

Figure 19:
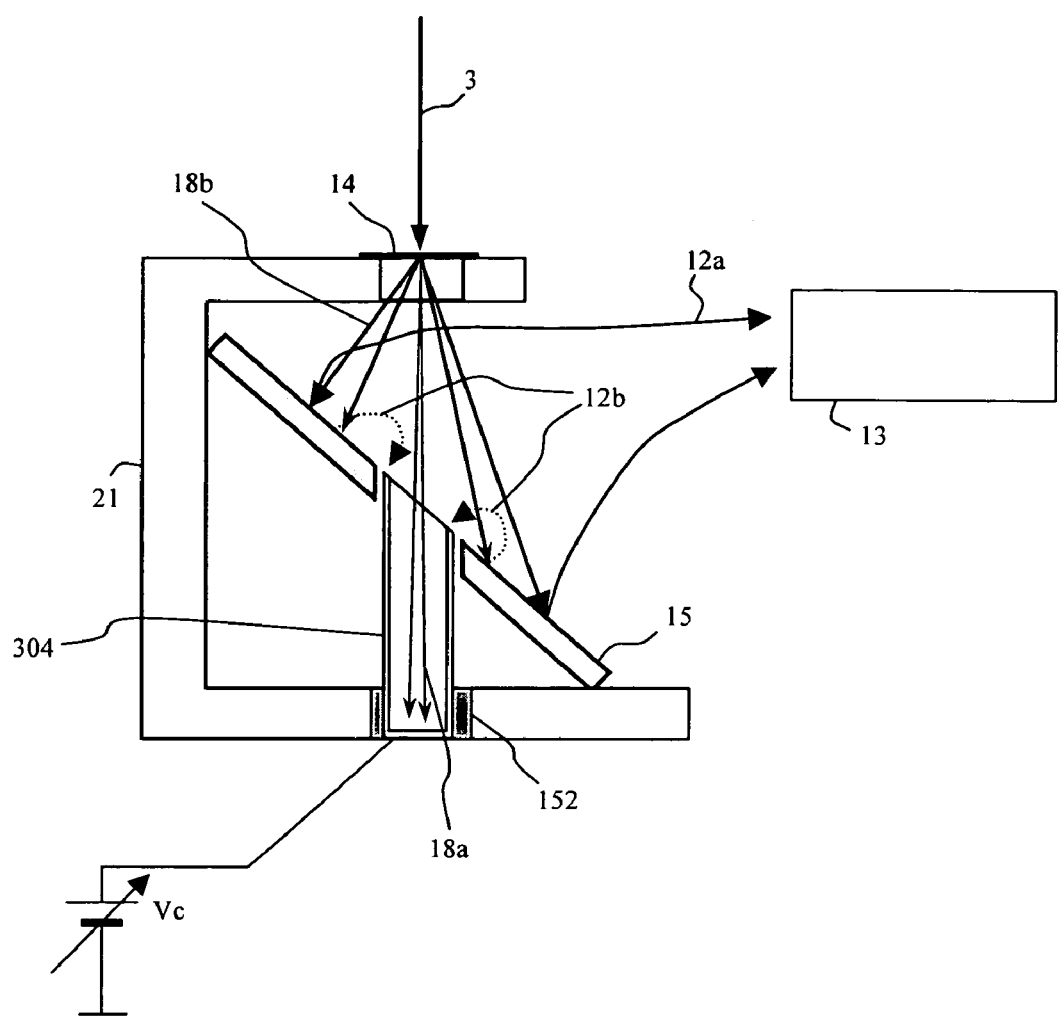
FIG. 19 illustrates an example that suppresses the detection of the secondary signal particles by applying a positive voltage to a cylindrical structure.

Further, as shown in FIG. 19, by insulating the cylindrical structure 304 against the sample mount 21 with an insulator 152, and applying the positive voltage Vc to the cylindrical structure 304, it is possible to suppress with a high efficiency the detection of the secondary signal particles derived from the bright field transmitted signal particles 18a.

Further, in the above construction, when the dark field signal particles 18b collide against the transmitted signal conversion member 15, the secondary signal particles 12a are emitted from the conversion member 15. However, since the secondary signal particles 12b emitted near the cylindrical structure 304 are attracted to the electrostatic field by the positive voltage applied to the cylindrical structure 304, the secondary signal particles 12b are not detected by the detector 13. By raising the voltage to the cylindrical structure 304, the secondary signal particles are attracted to the cylindrical structure 304 in a wider area from the center of the cylindrical structure 304. By controlling the positive voltage applied to the cylindrical structure 304, the lower limit of the detected scattering angle of the dark field signal detected by the detector 13 can be controlled.

In the above description of the embodiment, the point of the problem is considered as the mixture of the information of the inverted bright field signal. However, this is, in other words, the mixture of the dark field signal having a low scattering angle.

According to the construction of this embodiment, it is possible to separately detect the signal particles emitted from the surface of the sample, the dark field signal particles scattered within and transmitted through the sample, and the bright field signal particles transmitted through the sample without being scattered therein; especially, it is also possible to easily grasp the dispersion state of a heavy element in the sample containing both the heavy element and a light element.

This embodiment has been described mainly with the example of the scanning transmission electron microscope; however it is not confined to this, and it is applicable, for example, to a focused ion beam device. The invention is applicable to the whole device that transmits charged particles through a sample, and observes a transmitted signal image thereof.

According to the present invention, it is possible to detect the secondary signal particles emitted from the surface of the sample, the dark field signal particles scattered within and transmitted through the sample, and the bright field signal particles transmitted through the sample without being scattered therein individually separately, which makes it possible to observe the sample image with the optimum contrast according to applications.

What is claimed is:

1. A charged particle beam device having a source of charged particles, and a charged particle optical system for focusing primary charged particle beams emitted from said source of charged particles and scanning the primary charged beams on a sample, said device comprising:
   a transmitted signal conversion member for emitting secondary charged particles by collisions of charged particles transmitted through the sample; and
   an opening of a size, formed in said transmitted signal conversion member, through which the charged particles scattered within and transmitted through the sample can pass,
   said charged particle optical system having an objective lens which is configured to leak a magnetic field toward the sample positioned below said objective lens and to form a focusing magnetic field such that an intensity of the focusing magnetic field at a position of the sample is stronger than at a position of said transmitted signal conversion member.

2. A charged particle beam device as claimed in claim 1, further comprising a detector for detecting the secondary charged particles converted by said transmitted signal conversion member.

3. A charged particle beam device as claimed in claim 1, wherein transmitted signal particle detection means is disposed at a position to detect transmitted signal particles having passed through said opening of said transmitted signal conversion member.

4. A charged particle beam device as claimed in claim 3, wherein an aperture for obstructing part of the transmitted signal particles reaching said transmitted signal particle detection means is disposed between said transmitted signal particle detection means and said transmitted signal conversion member.

5. A charged particle beam device as claimed in claim 1, comprising an objective lens for focusing the primary charged particle beams, wherein said objective lens is configured to leak a focusing magnetic field toward the sample.

6. A charged particle beam device having a source of charged particles, and a charged particle optical system for focusing primary charged particle beams emitted from said source of charged particles and scanning the primary charged beams on a sample, said device comprising:
   a scintillator for emitting light by collisions of the charged particles transmitted through the sample;
   means for converting the light emitted from said scintillator into an electric signal at a position to detect the light;
   an opening of a size, formed in said scintillator, through which the charged particles transmitted through the sample without being scattered therein can pass; and
   an aperture for obstructing part of transmitted signal particles.

7. A charged particle beam device as claimed in claim 6, wherein transmitted signal particle detection means is disposed at a position to detect transmitted signal particles having passed through said opening of said scintillator.

8. A charged particle beam device as claimed in claim 7, wherein said aperture is disposed between said transmitted signal particle detection means and said scintillator.

9. A charged particle beam device having a source of charged particles, and a charged particle optical system for focusing primary charged particle beams emitted from said source of charged particles and scanning the primary charged beams on a sample, said device comprising:
   a transmitted signal conversion member for emitting secondary charged particles by collisions of charged particles transmitted through the sample; and
   a detector for attracting and detecting the secondary charged particles emitted from said transmitted signal conversion member, wherein said objective lens for focusing the primary charged particle beams is configured to leak a focusing magnetic field toward the sample,
   said charged particle optical system having an objective lens which is configured to leak a magnetic field toward the sample positioned below said objective lens and to form a focusing magnetic field such that an intensity of the focusing magnetic field at a position of the sample is stronger than at a position of said transmitted signal conversion member.

10. A charged particle beam device having a source of charged particles, and a charged particle optical system for focusing primary charged particle beams emitted from said source of charged particles and scanning the primary charged beams on a sample, said device comprising:
    a transmitted signal conversion member for emitting secondary charged particles by collisions of charged particles transmitted through the sample;
    an opening of a size, formed in said transmitted signal conversion member, through which the transmitted charged particles can pass; and
    a power supply for applying zero voltage or a positive voltage to said opening.

11. A charged particle beam device having a source of charged particles, and a charged particle optical system for focusing primary charged particle beams emitted from said source of charged particles and scanning the primary charged beams on a sample, said device comprising:
    a transmitted signal conversion member for emitting secondary charged particles by collisions of charged particles transmitted through the sample, wherein said transmitted signal conversion member includes two electrodes having openings for the transmitted charged particle beams to pass through, and a detector for detecting the secondary charged particles between said two electrodes.

12. A charged particle beam device as claimed in claim 11, wherein said two electrodes emit the secondary charged particles by collisions of the transmitted charged particles between said two electrodes.

13. A charged particle beam device as claimed in claim 12, wherein said two electrodes are configured such that the charged particle beams collide a plurality of times against said two electrodes.

14. A charged particle beam device having a source of charged particles, and a charged particle optical system for focusing primary charged particle beams emitted from said source of charged particles and scanning the primary charged beams on a sample, said device comprising:
 a dark field signal detector for detecting dark field signal particles transmitted through the sample;
 a bright field signal detector for detecting bright field signal particles transmitted through the sample;
 an aperture placed between said dark field signal detector and said bright field signal detector; and
 a power supply for applying a positive voltage to said aperture.

15. A charged particle beam device as claimed in claim 14, wherein said bright field signal detector includes a transmitted signal conversion member for emitting secondary charged particles by collisions of the dark field signal particles transmitted through the sample.

16. A charged particle beam device as claimed in claim 14, wherein said aperture is formed in a double structure.

17. A charged particle beam device having a source of charged particles, and a charged particle optical system for focusing primary charged particle beams emitted from said source of charged particles and scanning the primary charged beams on a sample, said device comprising:
 a dark field signal detector for detecting dark field signal particles transmitted through the sample, wherein said dark field signal detector includes a transmitted signal conversion member for emitting secondary charged particles by collisions of the dark field signal particles,
 said charged particle optical system having an objective lens which is configured to leak a magnetic field toward the sample positioned below said objective lens and to form a focusing magnetic field such that an intensity of the focusing magnetic field at a position of the sample is stronger than at a position of said transmitted signal conversion member.

18. A charged particle beam device as claimed in claim 17, comprising a bright field signal detector for detecting bright field signal particles having passed through said transmitted signal conversion member.

19. A charged particle beam device as claimed in claim 17, wherein said transmitted signal conversion member includes an opening, and a Faraday cup provided in said opening.

20. A charged particle beam device as claimed in claim 17, comprising a power supply for applying a positive voltage to said Faraday cup.

* * * * *